United States Patent

[11] 3,593,031

[72] Inventor Franz Jenik
Munich, Germany
[21] Appl. No. 859,685
[22] Filed Sept. 22, 1969
[45] Patented July 13, 1971
[73] Assignee Siemens Aktiengesellschaft
Berlin, Germany
[32] Priority Sept. 30, 1968
[33] Germany
[31] P 17 62 963.9

[54] OUTPUT SWITCHING AMPLIFIER
2 Claims, 3 Drawing Figs.

[52] U.S. Cl. .......... 307/214, 307/237, 307/254, 307/268, 330/15
[51] Int. Cl. .......... H03k 19/40
[50] Field of Search .......... 307/214, 215, 218, 237, 254, 268; 330/15

[56] References Cited
UNITED STATES PATENTS

| | | | |
|---|---|---|---|
| 3,299,363 | 1/1967 | Slattery et al. .......... | 307/214 X |
| 3,305,726 | 2/1967 | Goodman et al. .......... | 307/253 X |
| 3,405,285 | 10/1968 | Walsh et al. .......... | 307/239 |
| 3,423,603 | 1/1969 | Brown, Jr. .......... | 307/246 X |

*Primary Examiner*—Donald D. Forrer
*Assistant Examiner*—John Zazworsky
*Attorney*—Hill, Sherman, Meroni, Gross and Simpson

ABSTRACT: A low-ohmic resistor is connected between the collector of a first transistor and the emitter of a second transistor from which an output may be taken from a switching amplifier in order to aperiodically attenuate oscillations which arise at the output due to capacitive loading of the amplifier in order to prevent the heterodyning of such oscillations on the leading edge of the output signal.

PATENTED JUL 13 1971 3,593,031

INVENTOR
Franz Jenik

BY Hill, Sherman, Meroni, Gross & Simpson ATTYS.

OUTPUT SWITCHING AMPLIFIER

BACKGROUND OF THE INVENTION

1. Field of the Invention

This invention relates to output switching amplifiers, and more particularly to such amplifiers which offer the particular output potentials across low-ohmic paths in both stationary switching states.

2. Description of the Prior Art

Gate circuits with semiconductor diodes for the realization of logical fundamental functions (OR, AND, OR-NOT, AND-NOT) and combinations of these logical fundamental functions for the formation of relatively complicated logical functions in electronic apparatuses are known. For a relatively long time such gate circuits, for reasons of economy and circuitry flexibility, have been manufactured as discrete units, and recently on a large scale in so-called integrated technique. To each linking member in the narrower sense there is allocated an output switching amplifier, which is to bring about not only the regeneration of the signal pulses, but also the control power for the drive of a plurality of after-engaged gate circuits. Here, there has proved successful an amplifier circuit with two transistors which are alternately controlled conducting and blocked, and connect the amplifier output, according to the switching state, in a low-ohmic relationship with one or the other pole of the operating voltage source. For this purpose, the amplifier output is connected both over a diode with the collector of the first transistor, which transistor receives the input signal at its base, and also with the emitter of the second transistor. The two transistors are of the same conductivity type and the collector of the first transistor and the base of the second transistor are connected over a common resistor to one pole of the operating voltage source, while the emitter of the first transistor is connected to the other pole of the operating voltage source which forms the reference potential.

With the present state of semiconductor manufacture for such systems, especially in production in accordance with integrated circuit techniques, it is possible to achieve very short switching times, i.e. very steep pulse leading and trailing edges. Now there are, however, many cases of application of gate circuits in which such short switching times are not only not necessary, but are even troublesome, since with the steep pulse edges there is involved a strong high-frequency interference spectrum and thereby the danger of crosstalk onto adjacent lines, and the interference influence of other switching circuits increases. In such cases, therefore, the practice has been adopted of flattening the pulse edges in a defined manner and adapting the switching speed more or less to the particular requirements. This is easily achieved, as is well known, in the case of the output switching amplifiers described above, through the introduction of a capacitive feedback from the amplifier output to the input.

If the load of the amplifier output has a capacitive component, which is the case especially in the connection of several successive gate circuits and/or of relatively long lines in general, then in the transition from the low to the high output potential with respect to the reference potential there arises an interference oscillation, which oscillation is heterodyned on the rising pulse edge.

In many cases of utilization, the production of these interference oscillations at the output of gate circuits which are equipped with such output switching amplifiers does not involve any disadvantages; however, in other cases oscillations of this type lead to considerable difficulties. It is therefore the primary object of the invention to provide measures for the suppression of interference oscillations without impairing the other favorable properties of the output switching amplifier.

SUMMARY OF THE INVENTION

According to the invention an output amplifier of the type described above is provided with means between the amplifier output and the emitter of the second transistor for suppressing interference oscillations, the particular means being provided as a low-ohmic resistor which is serially connected between the emitter of the second transistor and the output terminal of the amplifier. This low-ohmic resistor is of such a magnitude to be effective to aperiodically attenuate the interference oscillations.

BRIEF DESCRIPTION OF THE DRAWINGS

Other objects, features and advantages of the invention will be readily apparent from the following description of a preferred embodiment thereof, taken in conjunction with the accompanying drawings, although variations and modifications may be effected without departing from the spirit and scope of the novel concepts of the disclosure, and in which.

DESCRIPTION OF THE PREFERRED EMBODIMENT

Figure 1:
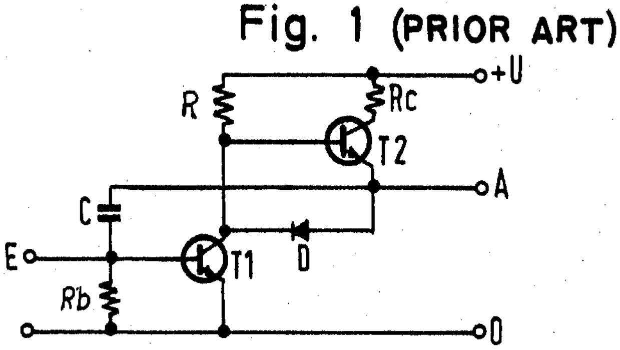
Fig. 1 (PRIOR ART)
FIG. 1 is a circuit diagram of a well-known output switching amplifier comprising a pair of transistors of the same conductivity type and having a feedback capacitance connected between the output of the amplifier and the input of the amplifier.
Figure 2:
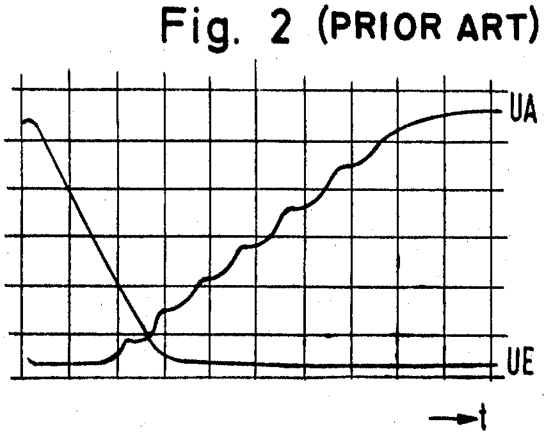
Fig. 2 (PRIOR ART)
FIG. 2 is a graphical illustration of the input and output signals with respect to time of the amplifier illustrated in FIG. 1.

Referring first to FIGS. 1 and 2, there is shown a well-known output switching amplifier which comprises a pair of transistors T1 and T2 of the same conductivity type. Transistor T1 has its base connected to an input terminal E for receiving an input signal UE. The emitter of transistor T1 is connected to a terminal O of an operating voltage source which is the reference potential for the circuit. The collector of transistor T1 is connected to the base of transistor T2 and over a resistor R in common thereto to a second pole +U of an operating voltage source. The collector of transistor T1 is also connected through a diode D to the emitter of transistor T2. The emitter of transistor T2 is connected to an output terminal A from which the output signal UA is taken. The emitter of transistor T2 and the output terminal A are also connected to the base of transistor T1 and the input terminal E by means of a capacitor C as a capacitive feedback which, as described above, is known in the prior art as a means for flattening the edges of the pulses. FIG. 2 is a graphical illustration showing the input signal UE and the output signal UA effected thereby with respect to time *t*. As can be seen in the drawing, capacitive loading of the output terminal A due to relatively long lines or other types of capacitively appearing loads, causes the appearance of an interference oscillation which is heterodyned onto the leading edge of the output pulse.

Figure 3:
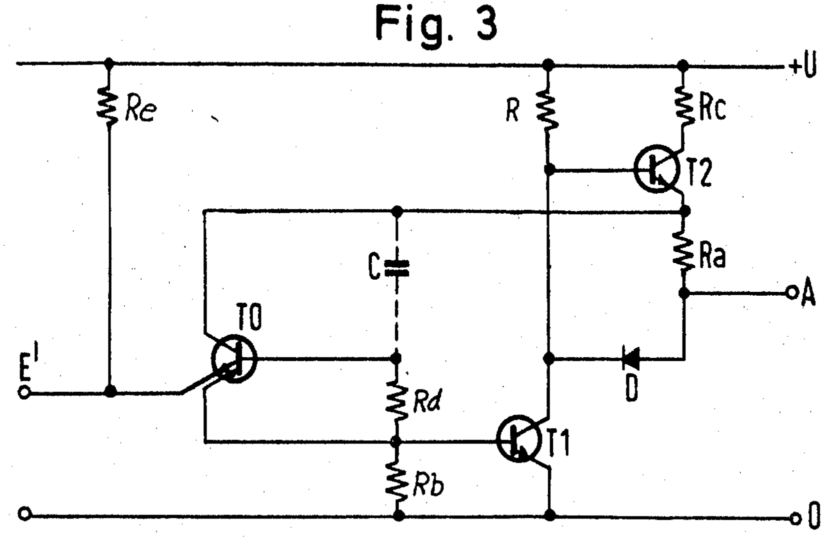
FIG. 3 is a circuit diagram of an output switching amplifier constructed in accordance with the principles of the present invention.

FIG. 3 illustrates an output switching amplifier in accordance with the present invention which comprises a pair of transistors T1 and T2 of the same conductivity type which are interconnected with each other and the operating voltage source substantially as shown in FIG. 1. In FIG. 3, however, the feedback capacitor C, which capacitor is indicated in the drawing by broken lines, is not realized by a capacitor of conventional construction, but in a known manner through a collector-base blocking layer capacitance of the transistor **T*o*. This possibility is utilized above all the construction in integrated switching circuit technology, since here the production of capacitors of sufficient capacitance in a conventional manner presents appreciable difficulties. In addition, the transistor T*o* can be drawn upon for the displacement of the response threshold of the output switching amplifier into a range which is favorable for the preengaged linking network. The transistor T*o* has its base connected through a first resistor R*d* to one emitter of transistor T*o* and to the base of transistor T1, and further through a resistor R*b* in series with resistor R*d* to the reference potential at terminal O of the operating voltage source. The collector of transistor T*o* is connected to the emitter of the transistor T2 and a second emitter of the transistor T***o* is connected through a resistor R*e* to the +U terminal of the operating voltage source. The input signal in the case of the circuit illustrated in FIG. 3 is applied not directly to the base of the transistor T1, but to the input terminal E' which is connected to one of the two emitters of the transistor T*o*.

According to the invention, a resistor R*a* is connected on the one hand to the emitter of the transistor T2 and on the other hand to the output terminal A of the amplifier and to the diode D. This resistor R*a* serves for the suppression of interference oscillations which otherwise occur on capacitive loading of the amplifier output and which would otherwise be heterodyned on the rising edge of the output signal.

The requisite resistance value for the resistor R*a* depends upon the dimensioning of the output amplifier and on the capacitive component of the load. Its magnitude is expediently determined by experiment under the worse case load conditions. The resistance values in question will usually lie between about 40 and 150 ohms.

It is further advantageous, in the final dimensioning of the amplifier to deduct the value of the resistor R*a* thus determined from the value of the resistor R*c* in order that the static internal resistance of the amplifier will not be increased. Theoretically the resistor R*c* is not required for the functioning of the circuit arrangement; however, it will be appreciated that the resistor R*c* is provided in most cases in order to protect the conducting transistor T2 from destruction in case of an accidentally occuring short circuit between the output terminal A and the reference potential. In the circuit arrangement according to the invention this protective action is taken over in part by the resistance R*a*.

An additional, very important effect of the resistor R*a* lies in that it prevents the influencing of the charging state of the feedback capacitor C (integration capacitance) by brief interference pulses which pass over the conducting line to the amplifier output. The dynamic interference security of the output switching amplifier or of the gate circuit connected with it is thereby appreciably increased.

I claim:

1. In an output switching amplifier having a pair of alternately controlled conducting transistors of the same conductivity type whose collectors are connected over separate resistances with one pole of an operating voltage source, and having a capacitive feedback from the emitter of the second transistor to the base of the first transistor, which base is adapted to receive an input signal, and having a direct connection of the base of the second transistor to the collector of the first transistor, and having an output terminal which is connected to the emitter of the second transistor and through a diode with the collector of the first transistor, the improvement therein comprising means interposed between the emitter of the second transistor and the output terminal for suppressing oscillations arising at the output terminal upon capacitive loading.

2. In an output switching amplifier according to claim 1, wherein said suppression means comprises a low-ohmic resistor connected between the output terminal and the emitter of the second transistor for aperiodically attenuating oscillations.